US010924133B2

(12) United States Patent
Nammi et al.

(10) Patent No.: US 10,924,133 B2
(45) Date of Patent: *Feb. 16, 2021

(54) REDUCING CONTROL CHANNEL OVERHEAD USING POLAR CODES

(71) Applicant: AT&T INTELLECTUAL PROPERTY I, L.P., Atlanta, GA (US)

(72) Inventors: SaiRamesh Nammi, Austin, TX (US); Xiaoyi Wang, Austin, TX (US); Arunabha Ghosh, Austin, TX (US)

(73) Assignee: AT&T INTELLECTUAL PROPERTY I, L.P., Atlanta, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/421,715

(22) Filed: May 24, 2019

(65) Prior Publication Data

US 2019/0280712 A1  Sep. 12, 2019

Related U.S. Application Data

(63) Continuation of application No. 15/400,512, filed on Jan. 6, 2017, now Pat. No. 10,348,328.

(51) Int. Cl.
*H03M 13/09* (2006.01)
*H03M 13/13* (2006.01)
(Continued)

(52) U.S. Cl.
CPC ........... *H03M 13/09* (2013.01); *H03M 13/13* (2013.01); *H03M 13/2906* (2013.01); *H04L 47/12* (2013.01); *H04L 47/821* (2013.01)

(58) Field of Classification Search
CPC ....... H04L 69/324; H04L 43/16; H04L 47/12; H04L 47/821; H03M 13/134; H03M 13/09; H03M 13/2906; H03M 13/13
See application file for complete search history.

(56) References Cited

U.S. PATENT DOCUMENTS 5,862,206 A    1/1999   Thomas et al.
6,621,851 B1   9/2003   Agee et al.
(Continued)

FOREIGN PATENT DOCUMENTS

CN           102164025 A     8/2011
KR   10-2011-0060635 A     6/2011
(Continued)

OTHER PUBLICATIONS

P. Giard, A. Balatsoukas-Stimming and A. Burg, "Blind detection of polar codes," 2017 IEEE International Workshop on Signal Processing Systems (SiPS), Lorient, 2017, pp. 1-6. (Year: 2017).*

(Continued)

*Primary Examiner* — Cynthia Britt
(74) *Attorney, Agent, or Firm* — Amin, Turocy & Watson, LLP

(57) ABSTRACT

Programming of frozen bits of first stage control channel information block enables scheduling information to be included for the second stage of the control channel information. By including some of the scheduling information for the second stage in the first stage frozen bits, the size of the first stage information blocks can be reduced, reducing the overhead required to transmit control information for the traffic channel. In an embodiment, the frozen bits can convey scheduling information that is lower priority than the scheduling information conveyed in the non-frozen bits of the first stage control channel information block. In another embodiment, the frozen bits can include parity bits, or cyclic redundancy check bits that are masked with the scheduling information.

20 Claims, 10 Drawing Sheets

(51) Int. Cl.
H03M 13/29 (2006.01)
H04L 12/801 (2013.01)
H04L 12/911 (2013.01)

(56) References Cited

U.S. PATENT DOCUMENTS

| | | | |
|---|---|---|---|
| 6,888,844 | B2 | 5/2005 | Mallory et al. |
| 7,035,255 | B2 | 4/2006 | Tzeng |
| 8,605,754 | B2 | 12/2013 | Siriwongpairat et al. |
| 9,176,927 | B2 | 11/2015 | Gross et al. |
| 9,178,532 | B2 | 11/2015 | Li et al. |
| 9,239,778 | B2 | 1/2016 | Lee et al. |
| 9,337,871 | B2 | 5/2016 | Li et al. |
| 9,402,255 | B2 | 7/2016 | Löhr et al. |
| 9,467,164 | B2 | 10/2016 | Ionita et al. |
| 9,503,126 | B2 | 11/2016 | Vardy et al. |
| 10,028,210 | B1 | 7/2018 | Nammi et al. |
| 2009/0119088 | A1 | 5/2009 | Ferris |
| 2014/0173376 | A1 | 6/2014 | Jeong et al. |
| 2015/0194987 | A1 | 7/2015 | Li et al. |
| 2015/0349909 | A1 | 12/2015 | El-Khamy et al. |
| 2015/0358113 | A1 | 12/2015 | Callard et al. |
| 2015/0381208 | A1 | 12/2015 | Li et al. |
| 2016/0079999 | A1 | 3/2016 | Shen et al. |
| 2016/0164629 | A1 | 6/2016 | Ahn et al. |
| 2016/0241258 | A1 | 8/2016 | Zeng et al. |
| 2016/0285479 | A1 | 9/2016 | El-Khamy et al. |
| 2016/0352464 | A1 | 12/2016 | Shen et al. |
| 2017/0289971 | A1 | 10/2017 | Wu et al. |
| 2017/0338996 | A1 | 11/2017 | Sankar et al. |
| 2017/0353271 | A1 | 12/2017 | Kudekar et al. |
| 2017/0366199 | A1* | 12/2017 | Ge .................. G06F 11/1004 |
| 2017/0367046 | A1 | 12/2017 | Papasakellanou |
| 2018/0007683 | A1 | 1/2018 | You et al. |
| 2018/0048418 | A1 | 2/2018 | Ge et al. |
| 2018/0054278 | A1 | 2/2018 | Shi et al. |
| 2018/0076923 | A1 | 3/2018 | Wu et al. |
| 2018/0097580 | A1 | 4/2018 | Zhang et al. |
| 2018/0167946 | A1 | 6/2018 | Si et al. |
| 2018/0183464 | A1 | 6/2018 | Ge |
| 2018/0191459 | A1 | 7/2018 | Ge et al. |
| 2018/0191465 | A1 | 7/2018 | Saber et al. |
| 2018/0192403 | A1 | 7/2018 | Shelby et al. |
| 2018/0198467 | A1 | 7/2018 | Nammi et al. |
| 2018/0198469 | A1 | 7/2018 | Sarkis et al. |
| 2018/0198555 | A1 | 7/2018 | Wu et al. |
| 2018/0198560 | A1 | 7/2018 | Jiang et al. |
| 2018/0198561 | A1 | 7/2018 | Tsai et al. |
| 2018/0199350 | A1 | 7/2018 | John Wilson et al. |
| 2019/0312679 | A1* | 10/2019 | Jayasinghe ......... H03M 13/095 |
| 2020/0067530 | A1* | 2/2020 | Xu .................. H03M 13/13 |
| 2020/0076535 | A1* | 3/2020 | Xu .................. H04L 69/324 |

FOREIGN PATENT DOCUMENTS

| | | |
|---|---|---|
| KR | 10-1600759 B1 | 3/2016 |
| WO | 2014/173133 A1 | 10/2014 |
| WO | 2016/204713 A1 | 12/2016 |

OTHER PUBLICATIONS

H. Mandavifar, M. El-Khamy, J. Lee and I. Kang, "Polar Coding for Bit-Interleaved Coded Modulation," in IEEE Transactions on Vehicular Technology, vol. 65, No. 5, pp. 3115-3127, May 2016. (Year: 2016).*

Braginsky et al. "CBPQ: High Performance LockFree Priority Queue." European Conference on Parallel Processing. Springer International Publishing, 2016, 14 pages.

Fan et al. "Lowlatency list decoding of polar codes with double thresholding." 2015 IEEE International Conference on Acoustics Speech and Signal Processing (ICASSP). IEEE, 2015, 5 pages.

Sarkis et al. "Unrolled polar decoders part ii: Fast list decoders." arXiv preprint arXiv:1505.01466, 2015, 9 pages.

Zhang et al. "Lowlatency SC decoder architectures for polar codes." arXiv preprint arXiv:1111.0705, 2011, 12 pages.

Non-Final Office Action received for U.S. Appl. No. 15/400,512 dated Aug. 7, 2018, 38 pages.

Final Office Action received for U.S. Appl. No. 15/400,512 dated Dec. 3, 2018, 30 pages.

* cited by examiner

600 ⟶

REDUCING CONTROL CHANNEL OVERHEAD USING POLAR CODES

RELATED APPLICATION

The subject patent application is a continuation of, and claims priority to, U.S. patent application Ser. No. 15/400,512 (now U.S. Pat. No. 10,348,328), filed Jan. 6, 2017 and entitled "REDUCING CONTROL CHANNEL OVERHEAD USING POLAR CODES," the entirety of which application is hereby incorporated by reference herein.

TECHNICAL FIELD

The disclosed subject matter relates to reducing control channel overhead using polar codes to enable improvement of wireless system performance over conventional wireless system technologies, e.g., for fifth generation (5G) technologies or other next generation networks.

BACKGROUND

To meet the huge demand for data centric applications, third generation partnership project (3GPP) systems and systems that employ one or more aspects of the specifications of fourth generation (4G) standards for wireless communications will be extended to fifth generation (5G) standards for wireless communications. Unique challenges exist to provide levels of service associated with forthcoming 5G and/or other next generation standards for wireless networks.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
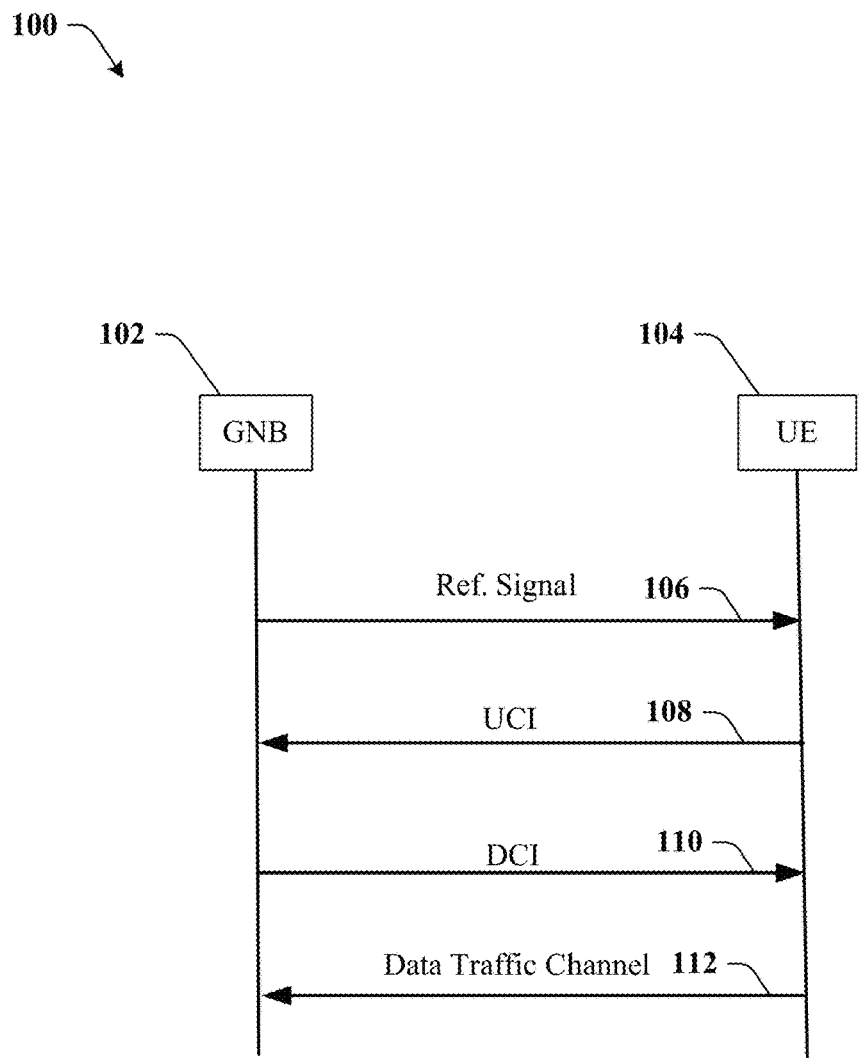
FIG. 1 illustrates an example schematic diagram of a message sequence chart for uplink and downlink control information in accordance with various aspects and embodiments of the subject disclosure.

One or more embodiments are now described with reference to the drawings, wherein like reference numerals are used to refer to like elements throughout. In the following description, for purposes of explanation, numerous specific details are set forth in order to provide a thorough understanding of the various embodiments. It is evident, however, that the various embodiments can be practiced without these specific details (and without applying to any particular networked environment or standard).

In an embodiment, a system can comprise a processor and a memory that stores executable instructions that, when executed by the processor, facilitate performance of operations, comprising determining locations of frozen bits in a first control channel information block, wherein the locations of the frozen bits are selected based on a type of polar code. The operations can also comprise coding non-frozen bits of the first control channel information block with a first portion of scheduling data associated with a second control channel information block. The operations can also comprise coding the frozen bits of the first control channel information block with a second portion of the scheduling data associated with the second control channel information block.

In another embodiment, a method can comprise determining, by a device comprising a processor, respective reliabilities of bit locations in a first control channel information block, wherein the respective reliabilities are based on a type of polar forward error correction code. The method can also coding, with a first portion of scheduling data and by the device, a first group of the bit locations determined to have first reliabilities above a first reliability threshold, wherein the scheduling data comprises information associated with a second control channel information block. The method can also comprise coding, with a second portion of the scheduling data and by the device, a second group of bit locations determined to have second reliabilities below a second reliability value.

In another embodiment, a machine-readable storage medium, comprising executable instructions that, when executed by a processor of a device, facilitate performance of operations. The operations can comprise determining respective reliabilities of bit locations in first stage control channel information block. The operations can also comprise determining that a first group of bit locations are determined to have reliabilities below a predetermined reliability threshold, wherein the first group of bit locations comprise cyclic redundancy check bits masked with scheduling data for a second stage control channel information block. The operations can also comprise unmasking the cyclic redundancy check bits with a bit combination selected from a group of bit combinations. The operations can also comprise determining the scheduling data using a result of unmasking the cyclic redundancy check bits.

Forward error correction codes can be used to improve the performance of communications channels by protecting the integrity of the information bits from interference, multipath fading, additive white Gaussian noise (AWGM) etc. In an embodiment polar forward error correction codes can be used in 5G wireless communication systems in order to protect control link channels, uplink and downlink. Polar codes, achieve the symmetric capacity of arbitrary binary-input discrete memory-less channels under a low complexity successive cancellation decoding strategy. When using polar codes, the reliability of certain bit locations in an information block can vary, and so, information that is to be protected can be coded into the bit locations that are above a predetermined reliability. Other bit locations, below the predetermined reliability threshold, are called "frozen bits" and are generally set as null bits and do not carry the payload data.

In some embodiments, control channel information can be transmitted in two or more stages, where the first stage provides some scheduling information and other control information regarding the second stage, and then the second stage comprises control information relating to the data traffic channel to follow. When using polar codes to encode the first and second stage control information blocks, scheduling information is generally included in the payload bits (e.g., non-frozen) of the information blocks, while the frozen bits are set to null.

In various embodiments as described herein, frozen bits of the first stage control channel information blocks can be programmed to comprise scheduling information for the second stage of the control channel information. By including some of the scheduling information for the second stage in the first stage frozen bits, the size of the first stage information blocks can be reduced, reducing the overhead required to transmit control information for the traffic channel. In an embodiment, the frozen bits can convey scheduling information that is lower priority than the scheduling information conveyed in the non-frozen bits of the first stage control channel information block. In another embodiment, the frozen bits can comprise parity bits, or cyclic redundancy check bits that are masked with the scheduling information. In another embodiment, if there are more frozen bits in the first stage control channel information block then there is scheduling data, the most reliable of the frozen bits will be used to convey the scheduling data.

Turning now to FIG. 1, illustrated is an example schematic diagram of a message sequence chart 100 for uplink and downlink control information in accordance with various aspects and embodiments of the subject disclosure. In an embodiment, a gNodeB 102 can send a reference signal 106 to a UE 104. The reference signal can be beamformed in some embodiments, or non beamformed in other embodiments.

Based on the reference signal 106, the UE 104 can measure the channel response, and determine channel state information (CSI) to give as feedback to the gNodeB 102. The channel state information can comprise a channel quality indicator, precoding matrix index, or advanced PMI. This channel state information can refer to the known channel properties of the communication link between the gNodeB 102 and the UE 104. The channel properties can reflect how the signal propagates from the transmitter to the receiver and represents the combined effect of, for example, scattering, fading, and power decay with distance.

Once the channel state information is assembled, the UE 104 can transmit the UCI 108 to the gNodeB 102. Based on the UCI 108, the gNodeB 102 can then send downlink control information (DCI) 110 to the UE 104 which enables the UE to send the data over the data traffic channel 112.

In an embodiment, the UCI 108 and DCI 110 can be sent in one or more stages, and be encoded using polar codes. Polar codes can be linear block error correcting codes that are constructed based on a multiple recursive concatenation of a short kernel code which transforms the physical channel into virtual outer channels. When the number of recursions becomes large, the virtual channels or bit locations tend to either have high reliability or low reliability (in other words, they polarize), and the data bits are allocated to the most reliable bit locations. Therefore, in an embodiment, high priority channel state information and scheduling information (e.g., resource allocation) contained in the UCI 108 and DCI 110 can be allocated to the reliable bit locations, while lower priority control information (e.g., modulation type, code rate, etc.) information can be allocated to the less reliable bit locations.

In an embodiment, the bit locations that have a reliability below a predetermined reliability level can be called frozen bits, while the bit locations that are above the predetermined reliability level can be call non-frozen bits, and be allocated to the payload data (e.g., channel state information). In an embodiment, encoding scheduling information can be performed using either single stage or multiple stage control channel information blocks, but in at least one embodiment disclosed herein, the control channel for both UCI 108 and DCI 110 is transmitted in two stages, where the first stage has resource allocation, scheduling, modulation and code rate information regarding a data traffic channel communication and/or the second stage of the control channel information. The second stage control channel information will contain channel state information and other control information relating to the data traffic channel.

In an embodiment, the scheduling information/modulation info/code rate that is included in the frozen bits of the information block can comprise 3 bits. And the predetermined reliability level can be set such that there are at least 3 bit locations below the reliability level such that there are enough frozen bit locations to accommodate the scheduling information. In embodiments where there are more than 3 frozen bits, or more frozen bits than scheduling data bits, the scheduling information can be allocated to the most reliable of the frozen bits. The remainder of the frozen bits can then be set to a fixed value (e.g., "0"). In at least one embodiment, the frozen bits can incorporate the CRC bits, which can then be masked with the scheduling information.

Figure 2:
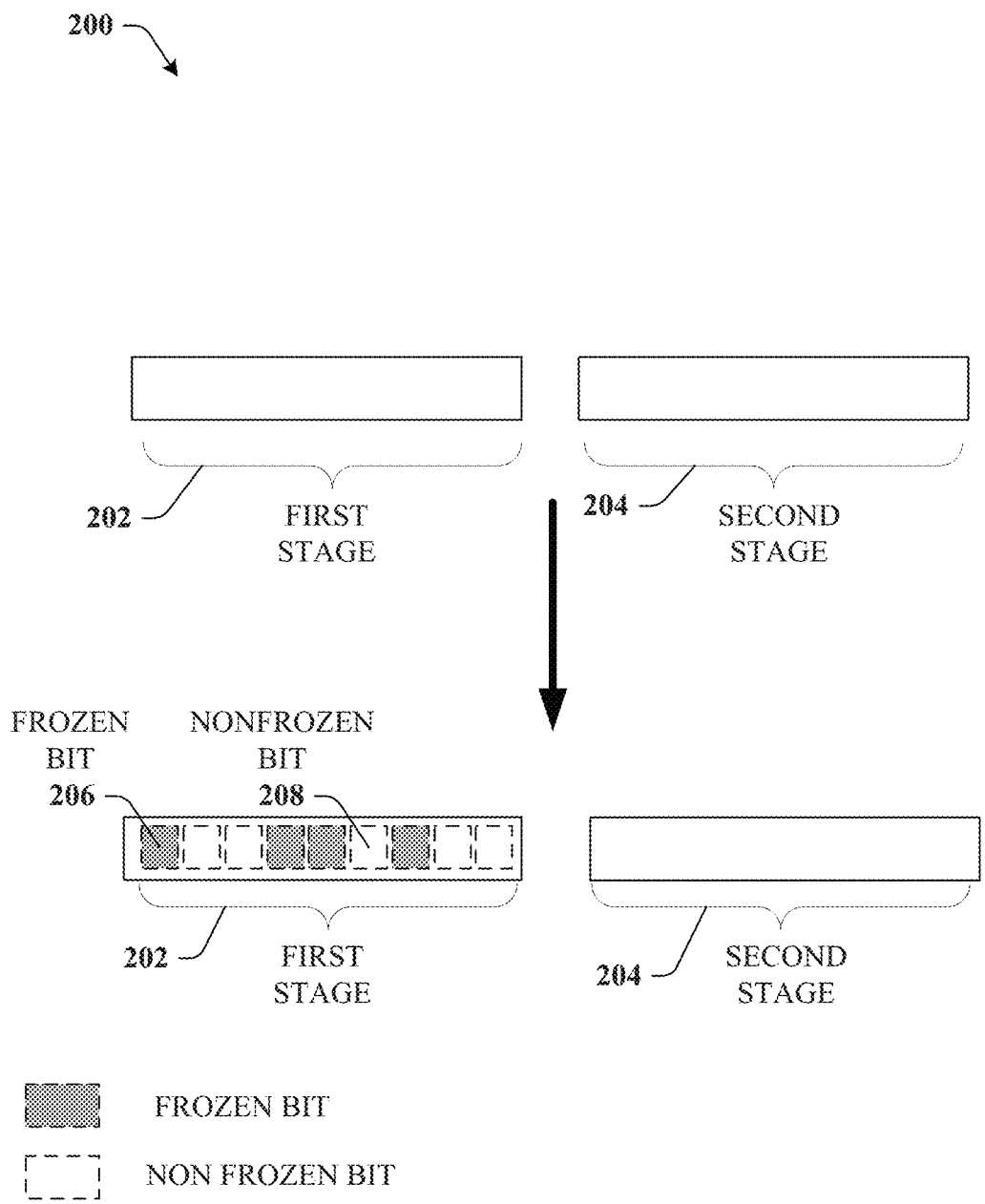
FIG. 2 illustrates an example block diagram of a first stage and second stage control channel information blocks with frozen and non-frozen bits in accordance with various aspects and embodiments of the subject disclosure.

Turning now to FIG. 2, illustrated is an example block diagram 200 of a first stage and second stage control channel information blocks with frozen and non-frozen bits in accordance with various aspects and embodiments of the subject disclosure. In an embodiment, a transmitter can determine the reliability of various bit locations in a first stage control channel information block 202 of control information and identify which bits are non-frozen bits e.g., bit 208, and which bits are frozen, e.g., bit 206. The first stage block 202 can be followed by a second stage control channel information block 204.

The system can identify which bits are frozen based on determining a reliability of each of the bit locations. The system can estimate the reliability based on signal to noise ratio at each of the bit locations or can perform fixed weight computations at each of the bit locations. In other embodiments, the system can use Bhattacharyya bounding which measures the similarity of two discrete or continuous probability distributions.

The system can rank the reliability (or the probability of a decoding error upon transmission of the information block 202) at each bit location, and bit locations with reliabilities above a predetermined threshold (e.g., probability of error below a specified level) will be non-frozen bits, chosen to transport the payload data of a first portion of control information. Bit locations with reliabilities below the predetermined threshold (e.g., probability of error above the specified level) will be frozen bits, and will be coded with the second portion of control information, or set to CRC bits which will then be masked with the second portion of control information.

In an embodiment, the first portion of control information that is programmed in the non-frozen bit locations, can comprise resource allocation information, while the second portion of information can comprise modulation information, scheduling information, or code rate information. In an embodiment, the second portion of control information can be lower in priority than the first portion. In an embodiment, the system can choose whether to include different types of control information in the non-frozen bits or frozen bits, based on the number and ratio of non-frozen bits to frozen bits. Similarly, the decision can be based upon the relative priorities of different types of control information, and the transmitter can attempt to maximize the amount of information that is conveyed in the non-frozen bit locations.

In an embodiment, the bit locations can be based on the type of polar code selected to encode/decode the control channels. Different polar codes, based on the encoding/decoding process, may have different locations that have different reliabilities. Similarly, for a given polar code, information blocks of different lengths may have different frozen and non-frozen bit locations.

In an embodiment, modulation and code rate can be specified using just three bits of information (e.g., three frozen bit locations). Using different binary representations, 8 different combinations of modulation and code rate can be specified, which can facilitate the receiver in receiving and processing the second stage control channel information block. An example of the combination is shown in Table 1 below.

| Binary representation | modulation | code rate |
|---|---|---|
| 000 | QPSK | 1/2 |
| 001 | QPSK | 1/3 |
| 010 | QPSK | 1/4 |
| 011 | QPSK | 1/6 |
| 100 | QPSK | 1/12 |
| 101 | 16 QAM | 1/2 |
| 110 | 16QAM | 1/3 |
| 111 | 16QAM | 1/9 |

As shown in Table 1, if an embodiment, the second stage needs to be encoded with 16QAM (quadrature amplitude modulation), and with a code rate of 1/3, then the first three frozen bits can be coded 1-1-0 as shown above. This will reduce the processing power of the receiver in trying to determine modulation scheme and code rate of the received codewords. By reducing the payload size of the first stage control channel by 3 bits, the entire size of the first stage control channel information block can be reduced by 3 bits, and the total number of resources required can be reduced. In other embodiments, other representations of modulation schemes and code rate and other scheduling information is possible.

Figure 3:
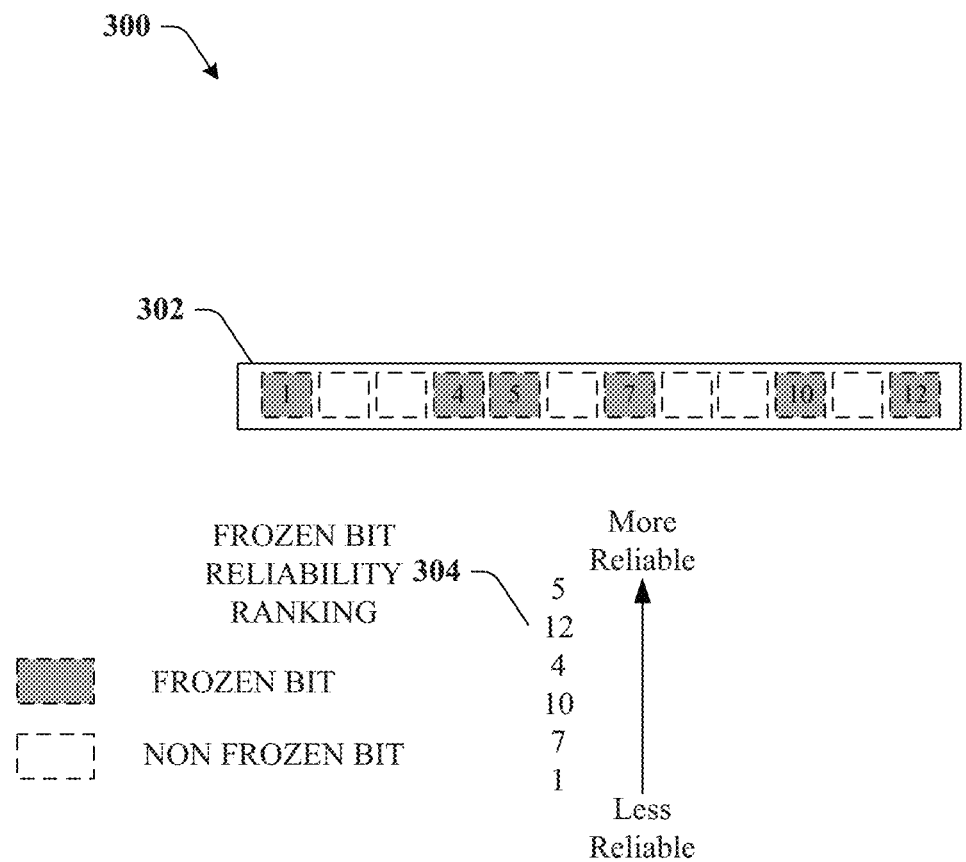
FIG. 3 illustrates an example block diagram of a first stage control channel information block with frozen bits ranked in reliability in accordance with various aspects and embodiments of the subject disclosure.

Turning now to FIG. 3, illustrated is an example block diagram 300 of a first stage control channel information block with frozen bits ranked in reliability in accordance with various aspects and embodiments of the subject disclosure.

The system can rank the reliability (or the probability of a decoding error upon transmission of the information block 302) at each bit location, and bit locations with reliabilities above a predetermined threshold (e.g., probability of error below a specified level) will be non-frozen bits, chosen to transport the payload data of channel state information. Bit locations with reliabilities below the predetermined threshold (e.g., probability of error above the specified level) will be frozen bits, and will be coded with the lower priority portion of the control information, or set to CRC bits which will then be masked with the control information.

In an embodiment, the system can determine that in information block 302 with 12 bit locations, there are 6 frozen bits, at bit locations 1, 4, 5, 7, 10, and 12. It is to be appreciated that in certain embodiments, the size of the information block 302 can be larger or smaller, with different numbers and proportions of frozen bits to non-frozen bits. In general, the size of the information block is large enough that the number of frozen bits is at least equal to the number of bits in the control information (e.g., 3 bits in an embodiment).

In an embodiment, the system can rank the reliability of the frozen bit locations at 304. In an embodiment, the bit location can be ranked, in order of highest reliability to lowest reliability, e.g., 4, 5, 12, 10, 7, 1. In an embodiment, to improve throughput and reduce the probability of the control information being corrupted, if the control information is 3 bits long, bit locations 4, 5, and 12 can be selected to encode the control information. In this way, the most reliable of the bit locations are used to code the control information.

In an embodiment, the control information can be encoded based on the order of the frozen bit locations within the information block. For instance, if the control information is 3 bits long, the 3 most reliable bit locations in the information block 302 can be selected in which to code the control information, e.g., bit locations 5, 12, and 4. In this embodiment, the control information of 1-2-3 can be coded into bit locations 4, 5, and 12 respectively.

In other embodiments, the control information can be encoded based on the reliability ranking. In this embodiment, the control information of 1-2-3 can be coded into bit locations 5, 12, and 4 respectively. The decoder on the receiver side, can rank the reliability of the bit locations in order to determine the correct order of the control information encoded in the frozen bit locations in order to decode the encoded code word.

Figure 4:
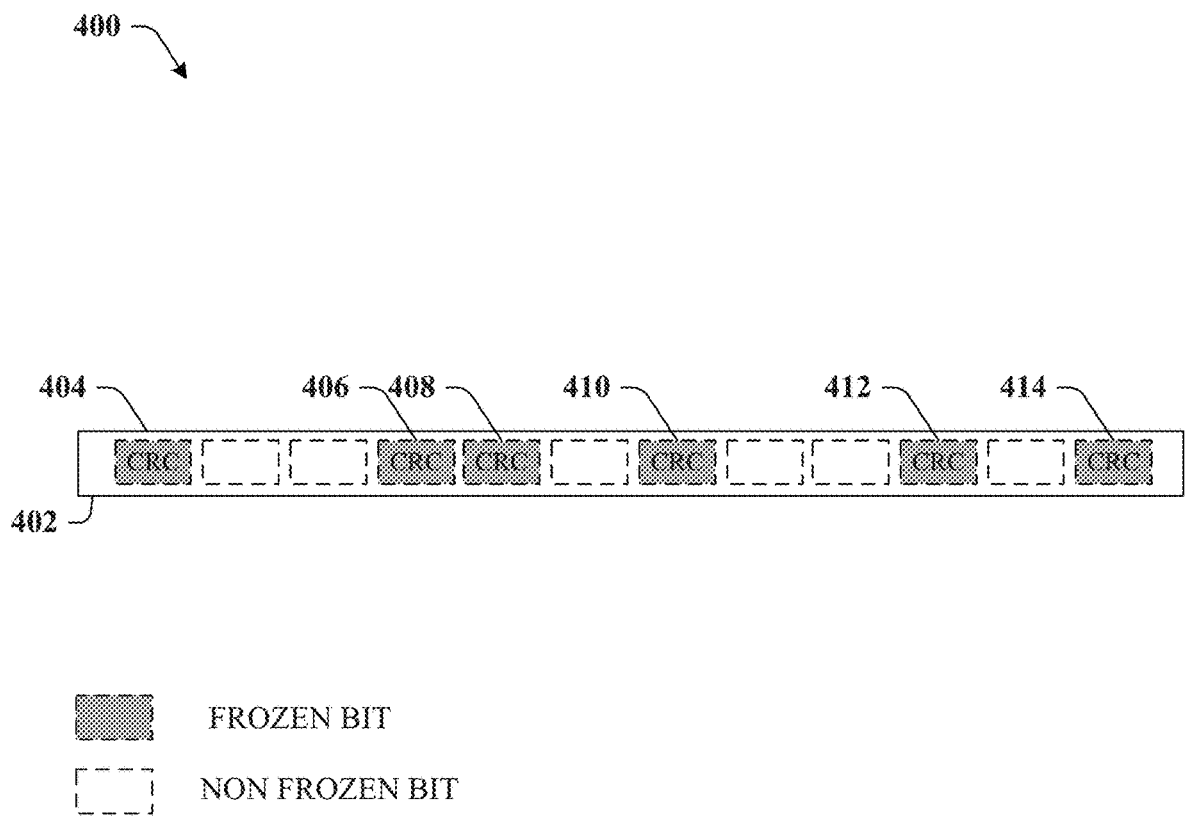
FIG. 4 illustrates an example block diagram of frozen bits in a first stage control channel information block coded with cyclic redundancy check bits in accordance with various aspects and embodiments of the subject disclosure.

Turning now to FIG. 4, illustrated is an example block diagram 400 of frozen bits in a first stage control channel information block coded with cyclic redundancy check bits in accordance with various aspects and embodiments of the subject disclosure.

In an embodiment, the frozen bit locations of information block 402 can be mapped with CRC bits at 404, 406, 408, 410, 412, and 414. The cyclic redundancy check (CRC) bits can be masked with the control information of the user equipment or base station device to which the transmission is directed. In this way, devices which are not being addressed will be unable to decode the transmissions.

In an embodiment, the CRC bits can be masked with the control information, and then mapped to the frozen bit locations. In some embodiments, the CRC bits can be masked by performing a logical exclusive-or between the CRC bits and the control information.

Figure 5:
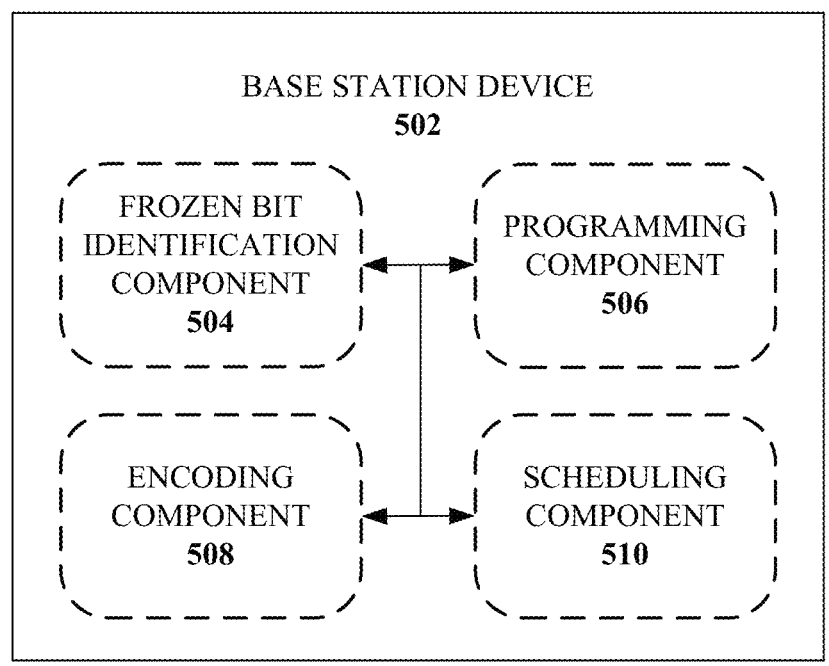
FIG. 5 illustrates an example block diagram of a base station device that facilitates encoding control channel data with a polar code in accordance with various aspects and embodiments of the subject disclosure.

Turning now to FIG. 5, illustrated is an example block diagram 500 of a base station device that facilitates encoding control channel data with a polar code in accordance with various aspects and embodiments of the subject disclosure.

The base station device 502 can comprise a frozen bit identification component 504 that is configured to determine locations of frozen bits in a first stage control channel information block, wherein the locations of the frozen bits are selected based on a type of forward error correction code. The base station device can also comprise a programming component 506 that is configured to code non-frozen bits of the control channel information block with control data to facilitate a data transmission and code the frozen bits of the control channel information block with a second portion of control information that will facilitate reception of a second stage control channel information block.

The base station device 502 can comprise a scheduling component 510 that can select which control information to include in the payload portion of the information block, and which control information to include in the frozen bit locations of the information block. The scheduling component 510 can make the determination based on ranking the types of control information to include, as well as using a table similar to the Table 1 above to determine how to code the frozen bits to convey scheduling information, code rate information, and modulation information.

In embodiment, the base station device 502 can also include an encoding component 508 that encodes the control channel information block with the forward error correction code into a codeword equal in length to a sum of the frozen bits and the non-frozen bits.

The frozen bit identification component 504 can identify which bits are frozen based on determining a reliability of each of the bit locations. The frozen bit identification component 504 can estimate the reliability based on signal to noise ratio at each of the bit locations or can perform fixed weight computations at each of the bit locations. In other embodiments, the frozen bit identification component 504 can use Bhattacharyya bounding which measures the similarity of two discrete or continuous probability distributions.

The frozen bit identification component 504 can rank the reliability (or the probability of a decoding error upon transmission of the information block) at each bit location, and bit locations with reliabilities above a predetermined threshold (e.g., probability of error below a specified level) will be non-frozen bits, chosen to transport the payload data of channel state information.

In an embodiment, the bit locations can be based on the type of polar code selected to encode/decode the control channels. Different polar codes, based on the encoding/decoding process, may have different locations that have different reliabilities. Similarly, for a given polar code, information blocks of different lengths may have different frozen and non-frozen bit locations.

The programming component 506 can program frozen bit locations with the second portion of the control information based on the order of the frozen bit locations within the information block. For instance, if the control information is 3 bits long, the 3 most reliable bit locations in the information block can be selected in which to code the control information, e.g., bit locations 5, 12, and 4 (from FIG. 3). In this embodiment, the control information of 1-2-3 can be coded into bit locations 4, 5, and 12 respectively.

In other embodiments, the control information can be programmed by the programming component 506 based on the reliability ranking. In this embodiment, the control information of 1-2-3 can be coded into bit locations 5, 12, and 4 respectively. The decoder on the receiver side, can rank the reliability of the bit locations in order to determine the correct order of the control information encoded in the frozen bit locations in order to decode the encoded code word.

Figure 6:
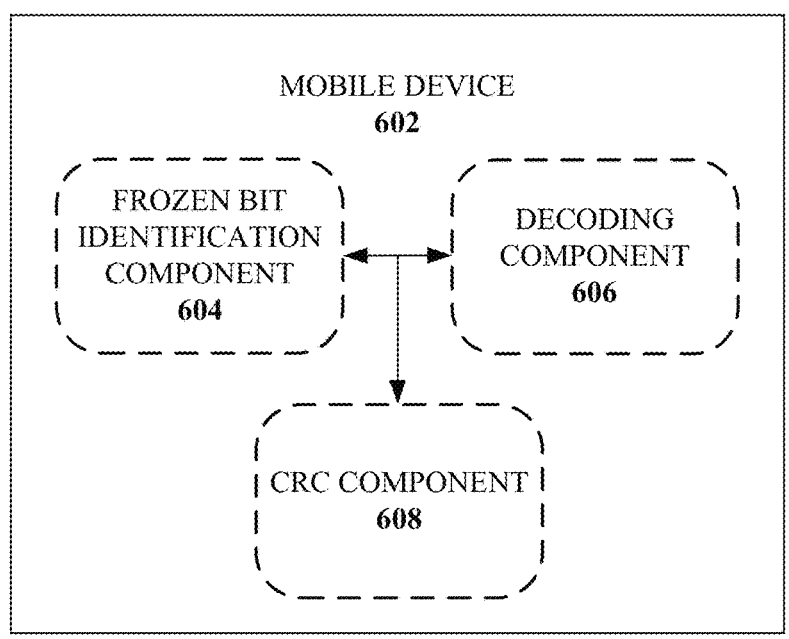
FIG. 6 illustrates an example block diagram of a mobile device that decodes control channel data with a polar code in accordance with various aspects and embodiments of the subject disclosure.

Turning now to FIG. 6, illustrated is an example block diagram 600 of a mobile device 602 that decodes control channel data with a polar code in accordance with various aspects and embodiments of the subject disclosure.

In an embodiment, the mobile device 602 can comprise a frozen bit identification component 604 that can determine locations of frozen bits in a control channel information block, wherein the locations of the frozen bits are determined based on a type of polar code. The frozen bit identification component 604 can also determine that a first group of bit locations are determined to have reliabilities below a predetermined reliability threshold, wherein the first group of bit locations comprise cyclic redundancy check bits masked with scheduling data for a second stage control channel information block.

The base station device can also comprise a decoding component 606 that is configured to decode the codeword that comprises the encoded control channel information block1 using the control information in the place of identified frozen bits. If the frozen bits also comprise the CRC bits, masked with the control information a CRC component 608 can perform a CRC check and facilitate unmasking the control information. In an embodiment, the CRC component 608 can iteratively apply different combinations of bits when trying to determine the CRC bits, and if the CRC bits are correct for a given combination of bits, then the CRC component 608 can compare the bits to a table, e.g., Table 1, which lists combinations of bits that are associated with different modulation schemes, code rates, scheduling information, and etc. In an embodiment, the CRC component 608 can iteratively apply the bit combinations that are already predetermined (e.g., Table 1) to try and calculate the CRC bits. When the CRC bits are correctly determined, the bit combination indicates the code rate and modulation scheme, which can be used to process and receive the second stage of control information.

Figure 7:
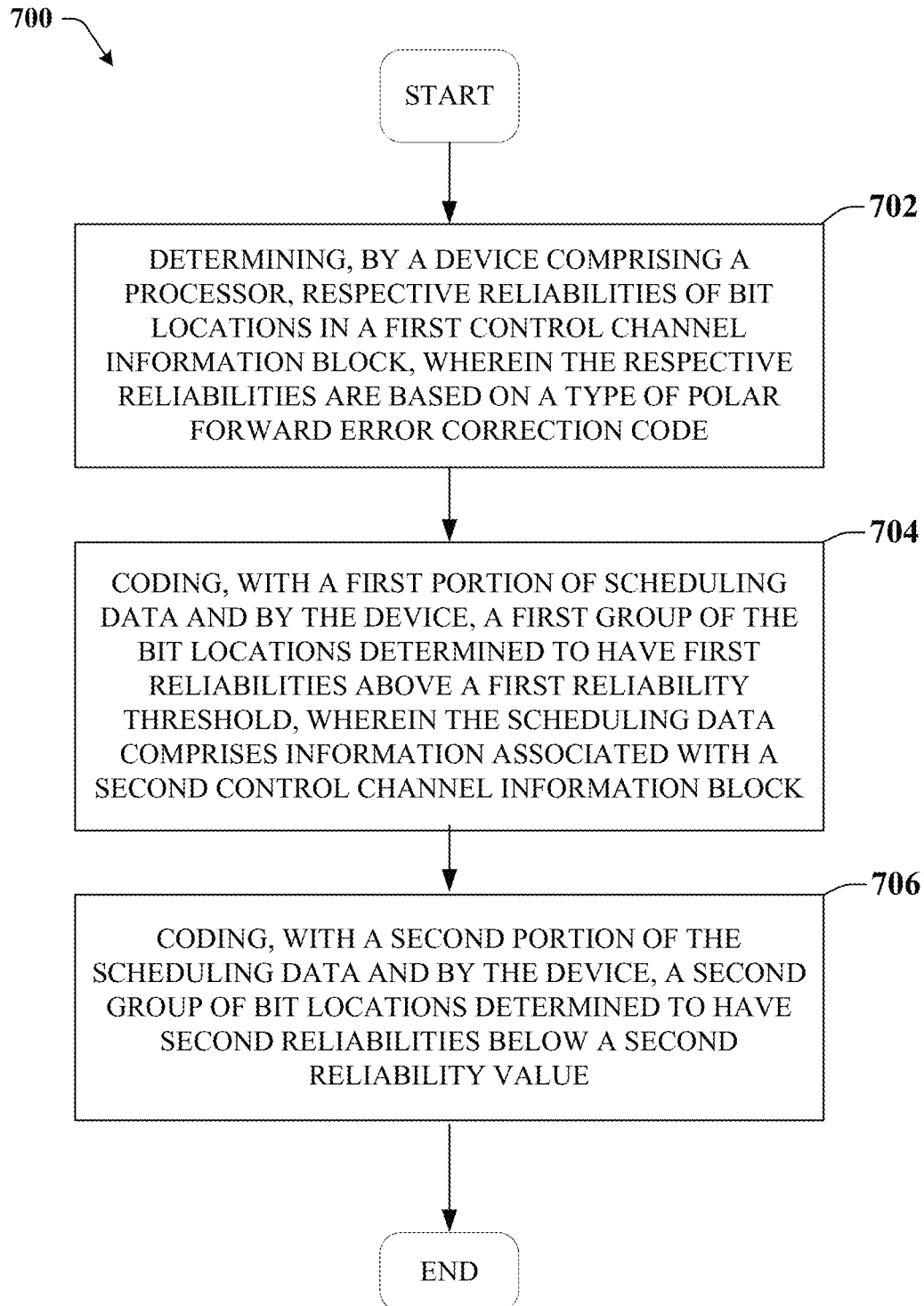
FIG. 7 illustrates an example method for reducing control channel overhead using polar codes in accordance with various aspects and embodiments of the subject disclosure.
Figure 8:
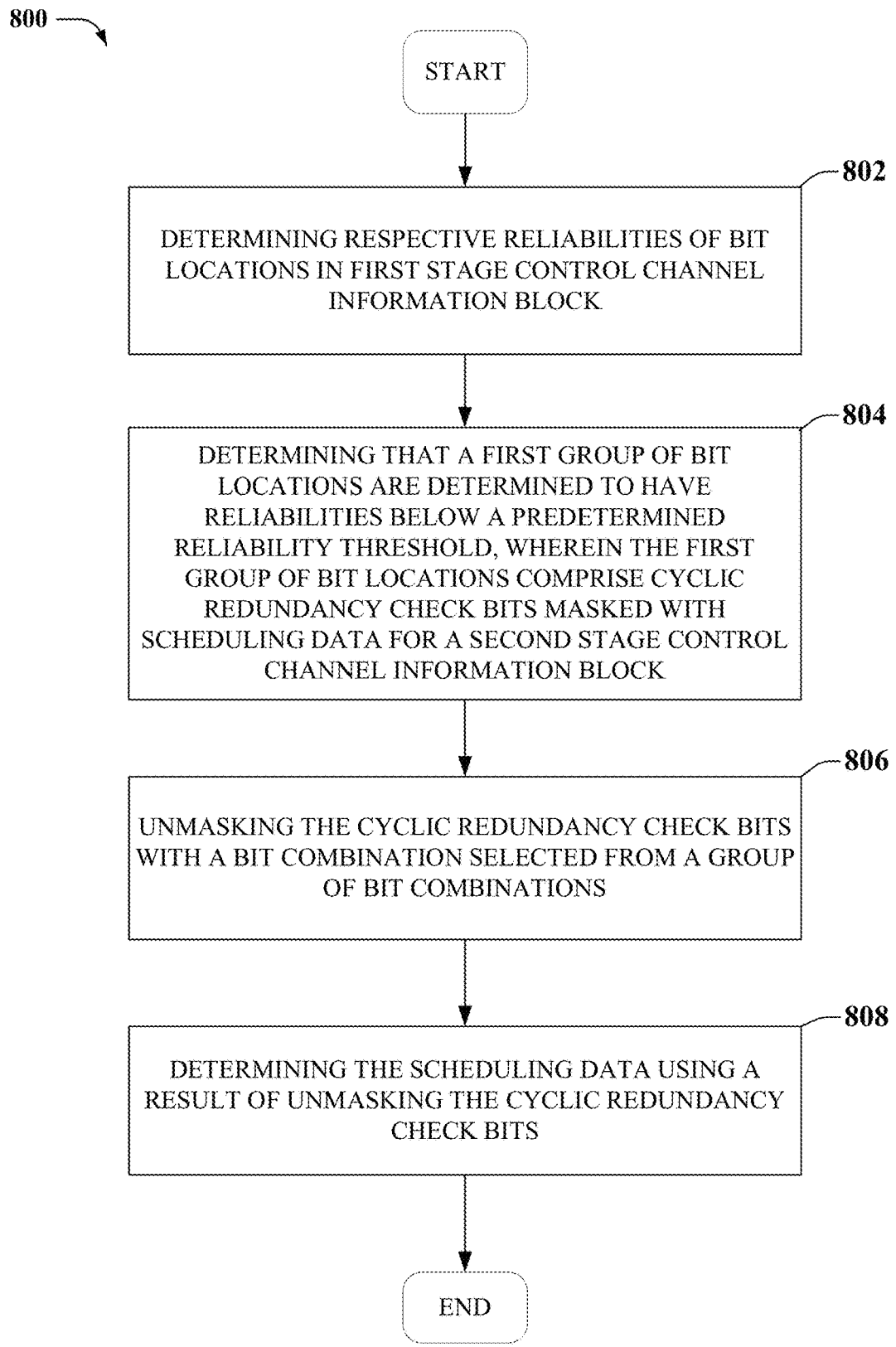
FIG. 8 illustrates an example method for decoding first stage control channel with polar codes in accordance with various aspects and embodiments of the subject disclosure.

FIGS. 7-8 illustrates a process in connection with the aforementioned systems. The process in FIGS. 7-8 can be implemented for example by the systems in FIGS. 1-6 respectively. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Turning now to FIG. 7, illustrated is an example method 700 for reducing control channel overhead using polar codes in accordance with various aspects and embodiments of the subject disclosure.

Method 700 can start at 702 where the method comprises determining, by a device comprising a processor, respective reliabilities of bit locations in a first control channel information block, wherein the respective reliabilities are based on a type of polar forward error correction code (e.g., by frozen bit identification component 504).

At 704, the method comprises coding, with a first portion of scheduling data and by the device, a first group of the bit locations determined to have first reliabilities above a first reliability threshold, wherein the scheduling data comprises information associated with a second control channel information block (e.g., by programming component 506).

At 706, the method comprises coding, with a second portion of the scheduling data and by the device, a second group of bit locations determined to have second reliabilities below a second reliability value (e.g., by programming component 506).

Turning now to FIG. 8, illustrated is an example method 800 for decoding first stage control channel with polar codes in accordance with various aspects and embodiments of the subject disclosure.

Method 800 can start at 802 where the method comprises determining respective reliabilities of bit locations in first stage control channel information block (e.g., frozen bit identification component 604).

At 804, the method comprises determining that a first group of bit locations are determined to have reliabilities below a predetermined reliability threshold, wherein the first group of bit locations comprise cyclic redundancy check bits masked with scheduling data for a second stage control channel information block (e.g., frozen bit identification component 604).

At 806, the method comprises unmasking the cyclic redundancy check bits with a bit combination selected from a group of bit combinations (e.g., CRC component 608).

At 808, the method comprises determining the scheduling data using a result of unmasking the cyclic redundancy check bits (e.g., CRC component 608).

Figure 9:
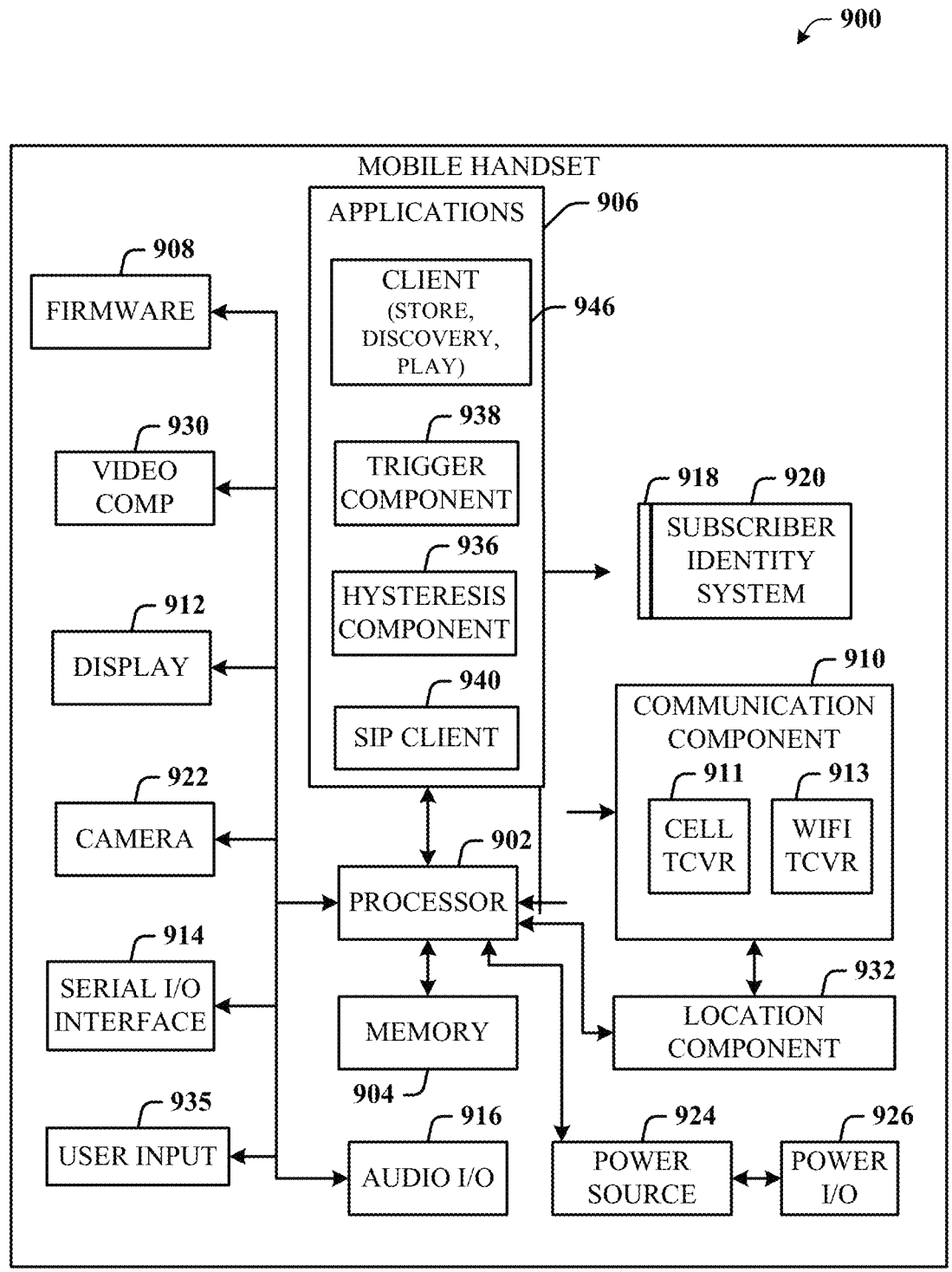
FIG. 9 illustrates an example block diagram of an example user equipment that can be a mobile handset operable to provide adaptive CRC in accordance with various aspects and embodiments of the subject disclosure.

Referring now to FIG. 9, illustrated is a schematic block diagram of an example end-user device such as a user equipment (e.g., mobile device 302 or 304) that can be a mobile device 900 capable of connecting to a network in accordance with some embodiments described herein. Although a mobile handset 900 is illustrated herein, it will be understood that other devices can be a mobile device, and that the mobile handset 900 is merely illustrated to provide context for the embodiments of the various embodiments described herein. The following discussion is intended to provide a brief, general description of an example of a suitable environment 900 in which the various embodiments can be implemented. While the description includes a general context of computer-executable instructions embodied on a machine-readable storage medium, those skilled in the art will recognize that the innovation also can be implemented in combination with other program modules and/or as a combination of hardware and software.

Generally, applications (e.g., program modules) can include routines, programs, components, data structures, etc., that perform particular tasks or implement particular abstract data types. Moreover, those skilled in the art will appreciate that the methods described herein can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices.

A computing device can typically include a variety of machine-readable media. Machine-readable media can be any available media that can be accessed by the computer and includes both volatile and non-volatile media, removable and non-removable media. By way of example and not limitation, computer-readable media can comprise computer storage media and communication media. Computer storage media can include volatile and/or non-volatile media, removable and/or non-removable media implemented in any method or technology for storage of information, such as computer-readable instructions, data structures, program modules or other data. Computer storage media can include, but is not limited to, RAM, ROM, EEPROM, flash memory or other memory technology, CD ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

The handset 900 includes a processor 902 for controlling and processing all onboard operations and functions. A memory 904 interfaces to the processor 902 for storage of data and one or more applications 906 (e.g., a video player software, user feedback component software, etc.). Other applications can include voice recognition of predetermined voice commands that facilitate initiation of the user feedback signals. The applications 906 can be stored in the memory 904 and/or in a firmware 908, and executed by the processor 902 from either or both the memory 904 or/and the firmware 908. The firmware 908 can also store startup code for execution in initializing the handset 900. A communications component 910 interfaces to the processor 902 to facilitate wired/wireless communication with external systems, e.g., cellular networks, VoIP networks, and so on. Here, the communications component 910 can also include a suitable cellular transceiver 911 (e.g., a GSM transceiver) and/or an unlicensed transceiver 913 (e.g., Wi-Fi, WiMax) for corresponding signal communications. The handset 900 can be a device such as a cellular telephone, a PDA with mobile communications capabilities, and messaging-centric devices. The communications component 910 also facilitates communications reception from terrestrial radio networks (e.g., broadcast), digital satellite radio networks, and Internet-based radio services networks.

The handset 900 includes a display 912 for displaying text, images, video, telephony functions (e.g., a Caller ID function), setup functions, and for user input. For example, the display 912 can also be referred to as a "screen" that can accommodate the presentation of multimedia content (e.g., music metadata, messages, wallpaper, graphics, etc.). The display 912 can also display videos and can facilitate the generation, editing and sharing of video quotes. A serial I/O interface 914 is provided in communication with the processor 902 to facilitate wired and/or wireless serial communications (e.g., USB, and/or IEEE 1394) through a hardwire connection, and other serial input devices (e.g., a keyboard, keypad, and mouse). This supports updating and troubleshooting the handset 900, for example. Audio capabilities are provided with an audio I/O component 916, which can include a speaker for the output of audio signals related to, for example, indication that the user pressed the proper key or key combination to initiate the user feedback signal. The audio I/O component 916 also facilitates the input of audio signals through a microphone to record data and/or telephony voice data, and for inputting voice signals for telephone conversations.

The handset 900 can include a slot interface 918 for accommodating a SIC (Subscriber Identity Component) in the form factor of a card Subscriber Identity Module (SIM) or universal SIM 920, and interfacing the SIM card 920 with the processor 902. However, it is to be appreciated that the SIM card 920 can be manufactured into the handset 900, and updated by downloading data and software.

The handset 900 can process IP data traffic through the communication component 910 to accommodate IP traffic from an IP network such as, for example, the Internet, a corporate intranet, a home network, a person area network, etc., through an ISP or broadband cable provider. Thus, VoIP traffic can be utilized by the handset 800 and IP-based multimedia content can be received in either an encoded or decoded format.

A video processing component 922 (e.g., a camera) can be provided for decoding encoded multimedia content. The video processing component 922 can aid in facilitating the generation, editing and sharing of video quotes. The handset 900 also includes a power source 924 in the form of batteries and/or an AC power subsystem, which power source 924 can interface to an external power system or charging equipment (not shown) by a power I/O component 926.

The handset 900 can also include a video component 930 for processing video content received and, for recording and transmitting video content. For example, the video component 930 can facilitate the generation, editing and sharing of video quotes. A location tracking component 932 facilitates geographically locating the handset 900. As described hereinabove, this can occur when the user initiates the feedback signal automatically or manually. A user input component 934 facilitates the user initiating the quality feedback signal. The user input component 934 can also facilitate the generation, editing and sharing of video quotes. The user input component 934 can include such conventional input device technologies such as a keypad, keyboard, mouse, stylus pen, and/or touch screen, for example.

Referring again to the applications 906, a hysteresis component 936 facilitates the analysis and processing of hysteresis data, which is utilized to determine when to associate with the access point. A software trigger component 938 can be provided that facilitates triggering of the hysteresis component 938 when the Wi-Fi transceiver 913 detects the beacon of the access point. A SIP client 940 enables the handset 900 to support SIP protocols and register the subscriber with the SIP registrar server. The applications 906 can also include a client 942 that provides at least the capability of discovery, play and store of multimedia content, for example, music.

The handset 900 can include an indoor network radio transceiver 913 (e.g., Wi-Fi transceiver). This function supports the indoor radio link, such as IEEE 802.11, for the dual-mode GSM handset 900. The handset 900 can accommodate at least satellite radio services through a handset that can combine wireless voice and digital radio chipsets into a single handheld device.

Figure 10:
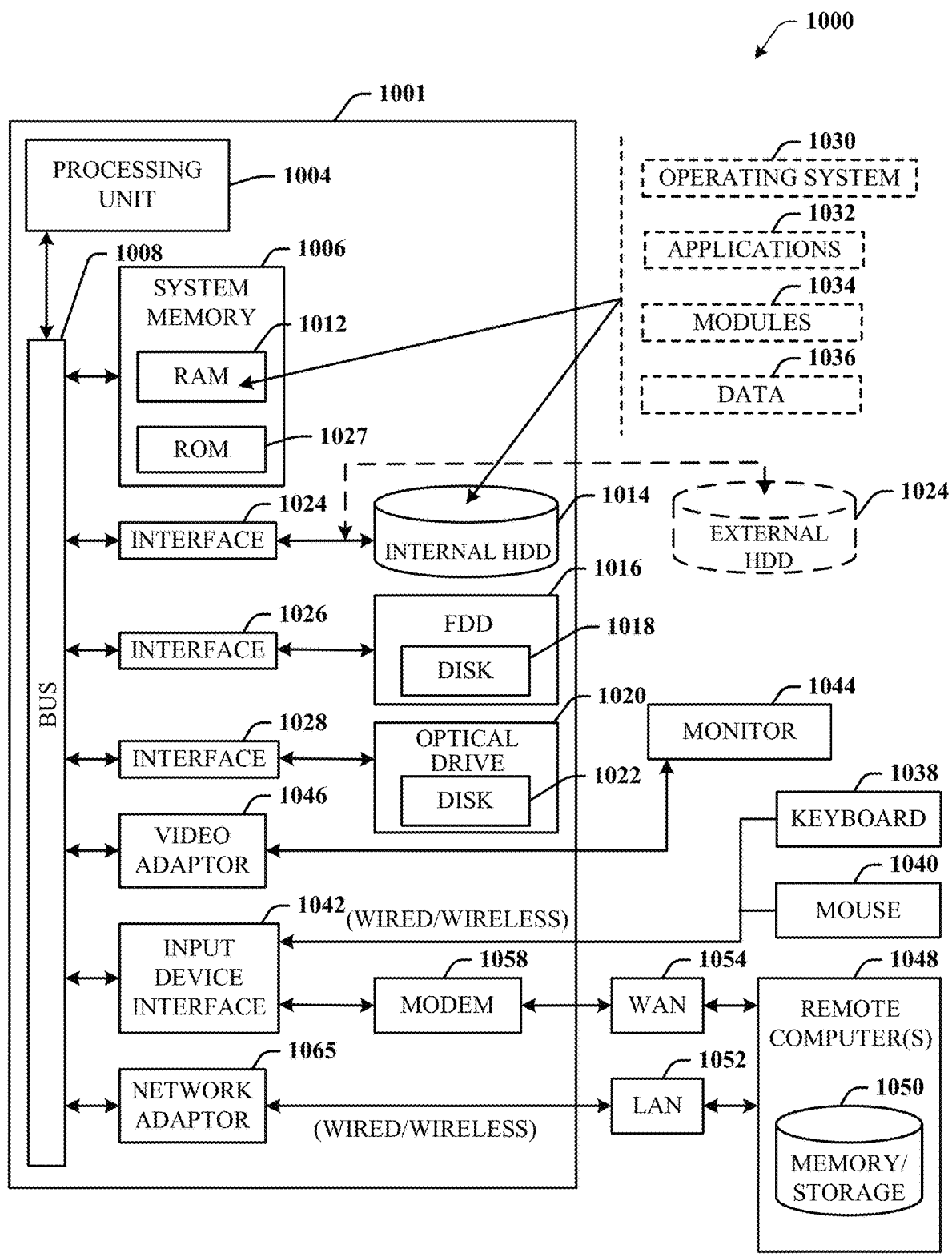
FIG. 10 illustrates an example block diagram of a computer that can be operable to execute processes and methods in accordance with various aspects and embodiments of the subject disclosure.

Referring now to FIG. 10, there is illustrated a block diagram of a computer 1000 operable to execute the functions and operations performed in the described example embodiments. For example, a network node (e.g., network node 306) may contain components as described in FIG. 10. The computer 1000 can provide networking and communication capabilities between a wired or wireless communication network and a server and/or communication device.

In order to provide additional context for various aspects thereof, FIG. 10 and the following discussion are intended to provide a brief, general description of a suitable computing environment in which the various aspects of the innovation can be implemented to facilitate the establishment of a transaction between an entity and a third party. While the description above is in the general context of computer-executable instructions that can run on one or more computers, those skilled in the art will recognize that the innovation also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the innovation can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media can embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference to FIG. 10, implementing various aspects described herein with regards to the end-user device can include a computer 1000, the computer 1000 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes read-only memory (ROM) 1027 and random access memory (RAM) 1012. A basic input/output system (BIOS) is stored in a non-volatile memory 1027 such as ROM, EPROM, EEPROM, which BIOS contains the basic routines that help to transfer information between elements within the computer 1000, such as during start-up. The RAM 1012 can also include a high-speed RAM such as static RAM for caching data.

The computer 1000 further includes an internal hard disk drive (HDD) 1014 (e.g., EIDE, SATA), which internal hard disk drive 1014 can also be configured for external use in a suitable chassis (not shown), a magnetic floppy disk drive (FDD) 1016, (e.g., to read from or write to a removable diskette 1018) and an optical disk drive 1020, (e.g., reading a CD-ROM disk 1022 or, to read from or write to other high capacity optical media such as the DVD). The hard disk drive 1014, magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE 1294 interface technologies. Other external drive connection technologies are within contemplation of the subject innovation.

The drives and their associated computer-readable media provide nonvolatile storage of data, data structures, computer-executable instructions, and so forth. For the computer 1000 the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer 1000, such as zip drives, magnetic cassettes, flash memory cards, cartridges, and the like, can also be used in the example operating environment, and further, that any such media can contain computer-executable instructions for performing the methods of the disclosed innovation.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. It is to be appreciated that the innovation can be implemented with various commercially available operating systems or combinations of operating systems.

A user can enter commands and information into the computer 1000 through one or more wired/wireless input devices, e.g., a keyboard 1038 and a pointing device, such as a mouse 1040. Other input devices (not shown) may include a microphone, an IR remote control, a joystick, a game pad, a stylus pen, touch screen, or the like. These and other input devices are often connected to the processing unit 1004 through an input device interface 1042 that is coupled to the system bus 1008, but can be connected by other interfaces, such as a parallel port, an IEEE 2394 serial port, a game port, a USB port, an IR interface, etc.

A monitor 1044 or other type of display device is also connected to the system bus 1008 through an interface, such as a video adapter 1046. In addition to the monitor 1044, a computer 1000 typically includes other peripheral output devices (not shown), such as speakers, printers, etc.

The computer 1000 can operate in a networked environment using logical connections by wired and/or wireless communications to one or more remote computers, such as a remote computer(s) 1048. The remote computer(s) 1048 can be a workstation, a server computer, a router, a personal computer, portable computer, microprocessor-based entertainment device, a peer device or other common network node, and typically includes many or all of the elements described relative to the computer, although, for purposes of brevity, only a memory/storage device 1050 is illustrated. The logical connections depicted include wired/wireless connectivity to a local area network (LAN) 1052 and/or larger networks, e.g., a wide area network (WAN) 1054. Such LAN and WAN networking environments are commonplace in offices and companies, and facilitate enterprise-wide computer networks, such as intranets, all of which may connect to a global communications network, e.g., the Internet.

When used in a LAN networking environment, the computer 1000 is connected to the local network 1052 through a wired and/or wireless communication network interface or adapter 1056. The adapter 1056 may facilitate wired or wireless communication to the LAN 1052, which may also include a wireless access point disposed thereon for communicating with the wireless adapter 1056.

When used in a WAN networking environment, the computer 1000 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 through the input device interface 1042. In a networked environment, program modules depicted relative to the computer, or portions thereof, can be stored in the remote memory/storage device 1050. It will be appreciated that the network connections shown are exemplary and other means of establishing a communications link between the computers can be used.

The computer is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE802.11 (a, b, g, n, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 2.4 and 5 GHz radio bands, at an 11 Mbps (802.11b) or 54 Mbps (802.11a) data rate, for example, or with products that contain both bands (dual band), so the networks can provide real-world performance similar to the basic "10BaseT" wired Ethernet networks used in many offices.

As used in this application, the terms "system," "component," "interface," and the like are generally intended to refer to a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. These components also can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry that is operated by software or firmware application(s) executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. An interface can comprise input/output (I/O) components as well as associated processor, application, and/or API components.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor also can be implemented as a combination of computing processing units.

In the subject specification, terms such as "store," "data store," "data storage," "database," "repository," "queue", and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory. In addition, memory components or memory elements can be removable or stationary. Moreover, memory can be internal or external to a device or component, or removable or stationary. Memory can comprise various types of media that are readable by a computer, such as hard-disc drives, zip drives, magnetic cassettes, flash memory cards or other types of memory cards, cartridges, or the like.

By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated example aspects of the embodiments. In this regard, it will also be recognized that the embodiments comprises a system as well as a computer-readable medium having computer-executable instructions for performing the acts and/or events of the various methods.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communications media comprise wired media, such as a wired network or direct-wired connection, and wireless media such as acoustic, RF, infrared and other wireless media Further, terms like "user equipment," "user device," "mobile device," "mobile," station," "access terminal," "terminal," "handset," and similar terminology, generally refer to a wireless device utilized by a subscriber or user of a wireless communication network or service to receive or convey data, control, voice, video, sound, gaming, or substantially any data-stream or signaling-stream. The foregoing terms are utilized interchangeably in the subject specification and related drawings. Likewise, the terms "access point," "node B," "base station," "evolved Node B," "cell," "cell site," and the like, can be utilized interchangeably in the subject application, and refer to a wireless network component or appliance that serves and receives data, control, voice, video, sound, gaming, or substantially any data-stream or signaling-stream from a set of subscriber stations. Data and signaling streams can be packetized or frame-based flows. It is noted that in the subject specification and drawings, context or explicit distinction provides differentiation with respect to access points or base stations that serve and receive data from a mobile device in an outdoor environment, and access points or base stations that operate in a confined, primarily indoor environment overlaid in an outdoor coverage area. Data and signaling streams can be packetized or frame-based flows.

Furthermore, the terms "user," "subscriber," "customer," "consumer," and the like are employed interchangeably throughout the subject specification, unless context warrants particular distinction(s) among the terms. It should be appreciated that such terms can refer to human entities, associated devices, or automated components supported through artificial intelligence (e.g., a capacity to make inference based on complex mathematical formalisms) which can provide simulated vision, sound recognition and so forth. In addition, the terms "wireless network" and "network" are used interchangeable in the subject application, when context wherein the term is utilized warrants distinction for clarity purposes such distinction is made explicit.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while a particular feature may have been disclosed with respect to only one of several implementations, such feature may be combined with one or more other features of the other implementations as may be desired and advantageous for any given or particular application. Furthermore, to the extent that the terms "includes" and "including" and variants thereof are used in either the detailed description or the claims, these terms are intended to be inclusive in a manner similar to the term "comprising."

The above descriptions of various embodiments of the subject disclosure and corresponding figures and what is described in the Abstract, are described herein for illustrative purposes, and are not intended to be exhaustive or to limit the disclosed embodiments to the precise forms disclosed. It is to be understood that one of ordinary skill in the art may recognize that other embodiments having modifications, permutations, combinations, and additions can be implemented for performing the same, similar, alternative, or substitute functions of the disclosed subject matter, and are therefore considered within the scope of this disclosure. Therefore, the disclosed subject matter should not be limited to any single embodiment described herein, but rather should be construed in breadth and scope in accordance with the claims below.

What is claimed is:

1. A system, comprising:
   a processor; and
   a memory that stores executable instructions that, when executed by the processor, facilitate performance of operations, comprising:
   determining locations of frozen bits in a first control channel information block, wherein the locations of the frozen bits are determined based on a type of polar code;
   coding non-frozen bits of the first control channel information block with a first portion of scheduling data that facilitates decoding a second control channel information block; and
   coding the frozen bits of the first control channel information block with a second portion of the scheduling data that facilitates decoding the second control channel information block.

2. The system of claim 1, wherein the second control channel information block comprises scheduling information for a traffic communication channel.

3. The system of claim 1, wherein the second portion of the scheduling data is lower priority than the first portion of the scheduling data.

4. The system of claim 1, wherein the first portion of the scheduling data comprises resource location information.

5. The system of claim 1, wherein the second portion of the scheduling data comprises modulation information or code rate information.

6. The system of claim 1, wherein the frozen bits have a decoding reliability determined to be below a predetermined reliability threshold.

7. The system of claim 1, wherein the coding the frozen bits comprises:
coding the frozen bits with cyclic redundancy check bits; and
masking the cyclic redundancy check bits with the second portion of the scheduling data.

8. The system of claim 1, wherein a first number of frozen bits is larger than a second number of bits of the second portion of the scheduling data, and wherein the frozen bits coded with the second portion of the scheduling data are determined to comprise most reliable bits of the frozen bits according to a defined reliability criterion.

9. The system of claim 1, wherein the operations further comprise:
determining a location of the locations of the frozen bits in the information block based on respective estimated signal to noise ratios of the locations.

10. The system of claim 1, wherein the operations further comprise:
determining a location of the locations of the frozen bits in the information block based on respective fixed weight computations of the locations.

11. A method, comprising:
determining, by a device comprising a processor, respective reliabilities of bit locations in a first control channel information block, wherein the respective reliabilities are based on a type of polar forward error correction code;
coding, with a first portion of scheduling data and by the device, a first group of the bit locations determined to have first reliabilities above a first reliability value, wherein the scheduling data comprises information that facilitates decoding a second control channel information block; and
coding, with a second portion of the scheduling data and by the device, a second group of the bit locations determined to have second reliabilities below a second reliability value.

12. The method of claim 11, wherein the second group of the bit locations comprises most reliable bit locations of the first control channel information block and excludes the first group of the bit locations.

13. The method of claim 12, wherein the second control channel information block comprises scheduling information for a communication channel.

14. The method of claim 11, wherein the second portion of the scheduling data is lower priority than the first portion of the scheduling data.

15. The method of claim 11, wherein the first portion of the scheduling data comprises resource location information.

16. The method of claim 11, wherein the second portion of the scheduling data comprises modulation information or code rate information.

17. The method of claim 11, wherein the coding the second group of the bit locations further comprises:
coding bits of the second group of the bit locations with cyclic redundancy check bits; and
masking the cyclic redundancy check bits with the second portion of the scheduling data.

18. A non-transitory machine-readable storage medium, comprising executable instructions that, when executed by a processor of a device, facilitate performance of operations, comprising:
determining respective reliabilities of bit locations in first stage control channel information block;
determining that a first group of the bit locations are determined to have reliabilities below a predetermined reliability threshold, wherein the first group of the bit locations comprises cyclic redundancy check bits masked with scheduling data that facilitates decoding a second stage control channel information block;
unmasking the cyclic redundancy check bits with a bit combination selected from a group of bit combinations; and
determining the scheduling data using a result of unmasking the cyclic redundancy check bits.

19. The non-transitory machine-readable storage medium of claim 18, wherein the unmasking further comprises:
checking a parity of the cyclic redundancy check bits.

20. The non-transitory machine-readable storage medium of claim 18, wherein the operations further comprise:
receiving the second stage control channel information block based on the scheduling data.

* * * * *